United States Patent
Austin et al.

(12)
(10) Patent No.: US 6,514,909 B1
(45) Date of Patent: Feb. 4, 2003

(54) DUAL LAYER SELF-CONTAINED PAPER INCORPORATING HOLLOW SPHERICAL PLASTIC PIGMENT

(75) Inventors: Robert A. Austin, Chillicothe, OH (US); Bruce A. Neeld, Chillicothe, OH (US); Peter C. Yao, Pickerington, OH (US); John K. Rourke, Chillicothe, OH (US); Trude J. Amick, Chapel Hill, NC (US); Willard W. McCarty, Kingston, OH (US)

(73) Assignee: The Mead Corporation, Dayton, OH (US)

( * ) Notice: Subject to any disclaimer, the term of this patent is extended or adjusted under 35 U.S.C. 154(b) by 135 days.

(21) Appl. No.: 09/630,396

(22) Filed: Aug. 2, 2000

Related U.S. Application Data

(60) Provisional application No. 60/184,542, filed on Feb. 24, 2000.

(51) Int. Cl.[7] .................................................. B41M 5/40
(52) U.S. Cl. ...................... 503/207; 427/152; 503/215; 503/226
(58) Field of Search .......................... 427/152; 503/207, 503/215, 226

(56) References Cited

U.S. PATENT DOCUMENTS

| | | | |
|---|---|---|---|
| 3,663,256 A | 5/1972 | Miller et al. | 117/36.2 |
| 3,732,120 A | 5/1973 | Brockett et al. | 117/16 |
| 4,440,846 A | 4/1984 | Sanders et al. | 430/138 |
| 4,554,235 A | 11/1985 | Adair et al. | 430/138 |
| 4,859,561 A | 8/1989 | Metz et al. | 430/138 |
| 4,956,309 A | 9/1990 | Adair et al. | 430/138 |
| 5,034,302 A | 7/1991 | Adair et al. | 430/138 |
| 5,932,515 A | 8/1999 | Rourke | 503/215 |
| 6,310,002 B1 * | 10/2001 | Kroska et al. | 503/213 |
| 6,407,035 B1 * | 6/2002 | Austin et al. | 503/201 |

FOREIGN PATENT DOCUMENTS

| | | |
|---|---|---|
| EP | 0375256 | 6/1990 |
| EP | 0449537 | 10/1991 |
| EP | 0545442 | 6/1993 |
| GB | 1215618 | 12/1970 |

* cited by examiner

*Primary Examiner*—Bruce H. Hess
(74) *Attorney, Agent, or Firm*—Thompson Hine LLP

(57) ABSTRACT

A self-contained sheet for forming an image comprising a support, a first layer of microcapsules containing a color precursor of the electron donating type in a carrier liquid on the surface of the support, a layer of microspheres overlying the microcapsule layer, and a developer material present in at least one of the microcapsule layer or microsphere layer, wherein the developer material can react with the color precursor to form a visible image when the color precursor is released from the microcapsules.

21 Claims, No Drawings

US 6,514,909 B1

DUAL LAYER SELF-CONTAINED PAPER INCORPORATING HOLLOW SPHERICAL PLASTIC PIGMENT

CROSS-REFERENCE TO RELATED APPLICATION

This application claims the benefit of U.S. provisional application Ser. No. 60/184,542, filed Feb. 24, 2000, the entire disclosure of which is incorporated herein by reference.

BACKGROUND OF THE INVENTION

The present invention relates to self-contained imaging sheets for use in copy systems such as pressure-sensitive carbonless paper, and, more particularly, to dual layer self-contained imaging sheets incorporating a hollow microspherical plastic pigment.

Carbonless copy systems and other copying systems employing a color precursor and a developer are well known in the art. These systems can comprise two sheets, a transfer or donor sheet which contains a colorless color-forming agent on one of its surfaces which is often contained in pressure rupturable microcapsules and a developer or receiver sheet, which is typically a substrate having a layer of a developer material coated onto its front surface which can react with the colorless color-forming agent to form a visible image. In practice, to produce an image, the two sheets are juxtaposed so that the colorless color-forming agent faces the developer material. Upon the application of pressure, such as from a pen, pencil, typewriter, or other writing instrument, the microcapsules are ruptured which releases the colorless color-forming agent. The color-forming agent reacts with the developer material on the developer sheet to form a visible image.

Transfer pressure-sensitive systems as described above are only one type of imaging system employing a color precursor and a developer. Other types that are known in the art are self-contained systems in which the color precursor and the developer are carried together on the same support (e.g., in the same or separate layers). Another type of copy system which employs a color precursor and a developer is thermal recording systems in which the color precursor is activated through the application of heat. Light sensitive copy systems such as the CYCOLOR system described in U.S. Pat. No. 4,399,209 are still another type of system which relies upon the interaction of a color precursor and a developer to form images.

Some conventional self-contained carbonless papers utilize a two layer coating system whereby a microcapsule-containing CB coating is applied to a substrate and then overcoated with a developer-containing CF coating. The CF coating functions not only as a developer, but also as a protective overlayer to prevent premature rupture of the pressure sensitive microcapsules in the CB coating. The dual layer self-contained structure provides improved smudge resistance and minimizes capsule damage during routine handling. One drawback associated with conventional two layer CF/CB self-contained coating systems is that a relatively high coat weight, typically around 2.9 #/ream (1300 ft$^2$), must be applied to produce a self-contained paper having suitable imaging characteristics. Combined coating containing both developer and microencapsulated color precursor can be applied at lower coat weights, but can result in unacceptable degrees of smudge and/or discoloration without a protective overcoat.

SUMMARY OF THE INVENTION

The present invention provides a self-contained sheet and self-contained systems including the same which provides improved image intensity and resistance to smudge. The self-contained sheet is characterized in that it utilizes a dual layer coating construction to improve the appearance of the sheet and the imaging performance of the self-contained system. The self-contained imaging sheet of the invention comprises: a support; a first layer of microcapsules containing a color precursor of the electron donating type in a carrier liquid on the surface of the support; a layer of hollow microspheres overlying the microcapsule layer; and a developer material present in at least one of the microcapsule layer or microsphere layer wherein the developer material can react with the color precursor to form a visible image when the color precursor is released from the microcapsules.

The dual layer structure of the self-contained imaging sheet is believed to be advantageous because the microspheres overlying the microcapsule layer appear to provide an opaque, energy absorbing protective barrier over the microcapsules. Furthermore, upon the application of an image-forming pressure, the microspheres contained in the top coat layer are believed to locally rupture, collapse, or dissolve and thereby form an interconnected network of microscopic voids. The microscopic voids are believed to provide improved image intensity as a result of increased surface area of the developer materials and capillary action. When a visible image is produced by the reaction of a colorless chromogenic material with the particulate developer, it is desirable to have a large number of pores in the layer containing the developer. According to one capillary model for oil transfer, the density of the image produced is proportional to the square root of the effective capillary radius of the developer material. Accordingly, an increase of the number of pores and/or effective capillary radius pore size increases the ease with which the color precursor contacts and reacts with the developer, thereby increasing the image density and speed of image development. The plastic pigment microspheres further enhance the image by contributing additional whiteness and opacity to the self-contained sheet.

One embodiment of the present invention is a self-contained sheet which provides faster development and improved image intensity through one or a combination of mechanisms. The self-contained sheet comprises a support having a microcapsule layer on one side thereof, a layer of hollow microspheres overlying the microcapsule layer and a developer material in at least one of the microcapsule layer or microsphere layer wherein the developer material can react with the color precursor to form a visible image when the color precursor is released from the microcapsules.

In one embodiment the present invention provides for a self-contained paper utilizing microspheres applied as a separate top coating over a reactive imaging layer of microcapsules and developer material. This construction of the self-contained paper is advantageous in that it provides the performance associated with a single layer self-contained coating such as image speed and density while minimizing potential drawbacks of the single layer self-contained coating such as premature capsule damage from handling (smudge) and discoloration and yellowing of the developer because the microsphere overlayer functions as a protective coating.

The present invention also provides for a self-contained paper utilizing a layer of microspheres and developer applied as a top coating over a layer of microcapsules. This construction of the self-contained paper is advantageous because the top coating again protects the microcapsules from premature rupture and creates a matrix of developer particles surrounding the microcapsules. Speed of image development and image intensity are enhanced by the proximity of the microcapsules to the developer particles. Upon the application of an imaging force, the encapsulated chromogenic contents are released from the microcapsules and react more quickly with the developer particles surrounding the microcapsules to form a visible image. Preferably, the microspheres and developer layer further comprises a high concentration a of mineral pigments which are believed to facilitate image formation by providing faster and more complete reaction of the chromogenic materials and the developer. Mineral pigments are believed to disperse developer particles more completely, thereby reducing agglomerates of developer particles. Color is developed more effectively by individual, separate particles.

Other objects and advantages of the present invention will be more fully understood and appreciated by reference to the following description and the appended claims.

DETAILED DESCRIPTION

In describing the preferred embodiment, certain terminology will be utilized for the sake of clarity. It is intended that such terminology include not only the recited embodiments but all technical equivalents which operate in a similar manner, for a similar purpose, to achieve a similar result.

The sheet of the present invention may be used in any imaging system in which a color precursor is reacted with a developer to form an image. More particularly, it may be used in pressure-sensitive self-contained recording systems, and thermal or heat-sensitive recording systems.

In accordance with another embodiment, the self-contained sheet of the present invention may be used in a photosensitive recording system. Photosensitive compositions, photoinitiators, color formers, wall formers, encapsulation techniques and developer materials useful in photosensitive recording systems are described in U.S. Pat. Nos. 4,399,209; 4,772,530; and 4,772,541 are useful herein. These patents are incorporated herein by reference.

The self-contained sheet includes a substrate having a front surface and a back surface. The substrate is typically paper but in certain applications it may be made of transparent polymeric materials such as polyethylene terephthalate, translucent substrates, opaque polymeric substrates such as Melinex 329 and Melinex 470 sold by ICI Americas, or polymer coated paper materials such as commercially available photographic papers and plain paper.

The microspheres used in the present invention are hollow spherical pigment particles made from a synthetic organic polymer or any inorganic shell-forming material such as glass or sodium silicate. Typically such microspheres have a diameter of approximately 0.3 $\mu$ to 15 $\mu$ and preferably about 1.0 micron. Such hollow synthetic organic pigment particles are known in the art and are commercially available from Rohm and Haas Corp. The microspheres provide a network of gas-filled voids in the microsphere layer. One example of a commercially available microsphere that is useful in the present invention is sold under the trade designation HP-1055 from Rohm and Haas. Porous hollow plastic pigments available from Dow under the trade designation HS 2000NA are also believed to be useful when used as microspheres in the present invention. Hollow polymer particles which are useful in this invention may be made in accordance with and having the properties disclosed in U.S. Pat. Nos. 3,784,391; 4,798,691; 4,908,271; 4,910,229; and 4,972,000; and Japanese Patent Applications 60/223873; 61/62510; 61/66710; 61/86941; 62/127336; 62/156387; 01/185311; and 02/140272; U.S. Pat Nos. 4,427,836; 4,469,825; 4,594,363; and 4,880,842. The disclosures therein related to the manufacture and composition of the hollow polymer particles are incorporated herein by reference. The preferred pigment has a soft compressible quality that yields a microscopic void under the application of writing or marking pressure.

Any of the developer materials that has been conventionally used or taught for use in any of the aforesaid recording systems should be useful in the self-contained sheets of this invention. The developer material is selected such that it reacts with the color precursor to produce a high density image. In the most typical embodiments, the color precursor is a substantially colorless electron donating compound of the type conventionally used in the pressure-sensitive recording art and the developer material is a solid particulate electron accepting compound.

The developer can be selected from among the developers conventionally used in carbonless paper including acid clay, active clay, attapulgite, etc.; organic acids such as tannic acid, gallic acid, propylgallate; aromatic carboxylic acids such as benzoic acid, p-tert-butyl-benzoic acid, 4-methyl-3-nitro-benzoic acid, salicylic acid, 3-phenyl salicylic acid, 3-cyclohexyl salicylic acid, 3-tert-butyl-5-methyl salicylic acid, 3,5-ditert-butyl salicylic acid, 3-methyl-5-benzyl salicylic acid, 3-phenyl-5-($\alpha,\alpha$-dimethylbenzyl)salicylic acid, 3-cyclohexyl-5-($\alpha,\alpha$-dimethylbenzyl)salicylic acid, 3-($\alpha,\alpha$-dimethylbenzyl)-5-methyl salicylic acid, 3,5-dicyclohexyl salicylic acid, 3,5-di-($\alpha$-methylbenzyl)salicylic acid, 3,5-di-($\alpha,\alpha$-dimethylbenzyl)salicylic acid, 3-($\alpha$-methylbenzyl)-5-($\alpha,\alpha$-dimethylbenzyl)salicylic acid, 4-methyl-5-cyclohexyl salicylic acid, 2-hydroxy-1-benzyl-3-naphthoic acid, 1-benzoyl-2-hydroxy-3-naphthoic acid, 3-hydroxy-5-cyclohexyl-2-naphthoic acid and the like, and polyvalent metallic salts thereof such as zinc salts, aluminum salts, magnesium salts, calcium salts and cobalt salts as disclosed in U.S. Pat. Nos. 3,864,146; 3,924,027 and 3,983,292; phenol compounds such as 6,6'-methylene-bis(4-chloro-m-cresol) as disclosed in Japanese Patent Publications 9,309 of 1965 and 20,144 of 1967, and Japanese Laid Open Patent Publication No. 14,409 of 1973; acid polymers such as maleic acid-rosin resin and copolymers of maleic anhydride with styrene, ethylene or vinylmethylether; and aromatic carboxylic acid-aldehyde polymers, aromatic carboxylic acid-acetylene polymers and their polyvalent metallic salts as disclosed in U.S. Pat. Nos. 3,767,449 and 3,772,052.

Preferred developer materials are phenolic resins, such as phenol-aldehyde resins e.g., p-phenyl-phenolformaldehyde resin; phenol-acetylene resins, e.g., p-tert-butylphenol-acetylene resin; polyvalent metallic salts thereof such as zinc modified phenol formaldehyde resin as disclosed in U.S. Pat. No. 3,732,120, and phenolic resins modified to include amounts of unsubstituted or substituted salicylic acids in a manner known in the art. One class of phenolic resin useful in the present invention is the product of oxidative coupling of substituted or unsubstituted phenols or bisphenols. Oxidative coupling may be catalyzed by various catalysts but a particularly desirable catalyst is the enzyme peroxidase. Particularly desirable developers are the resins described in commonly assigned U.S. Pat. No. 4,647,952, which is incorporated herein by reference, and more particularly the product of oxidative coupling of bisphenol A.

Especially preferred developer materials are phenol-formaldehyde condensation products. More particularly, alkylphenolic resins and, still more particularly, metallated products of alkylphenolic resins are preferred. The alkyl phenols are monosubstituted by an alkyl group which may contain 1 to 12 carbon atoms. Examples of alkyl phenols are ortho- or para-substituted ethylphenol, propylphenol, butylphenol, amylphenol, hexylphenol, heptylphenol, octylphenol, nonylphenol, t-butylphenol, t-octylphenol, etc. Another class of thermoplastic developer material which may be used within the scope of the present invention is a resin-like condensation product of a polyvalent metal salt, such as a zinc salt, and a phenol, a phenol-formaldehyde condensation product, or a phenol-salicylic acid-formaldehyde condensation product.

Useful phenolic developer resins are available from Schenectady Chemical Co. under the designations HRJ 2629, HRJ 2969, HRJ 4250 and HRJ 4542. The latter two products are reported to be a metallated condensation product of an ortho- or para-substituted alkylphenol, a substituted salicylic acid, and formaldehyde.

Substantially any of the color precursors conventionally used in carbonless paper can be used in the present invention. In general, these materials are colorless electron donating type compounds. Representative examples of such color formers include substantially colorless compounds having in their partial skeleton a lactone, a lactam, a sultone, a spiropyran, an ester or an amido structure. Specifically, there are triarylmethane compounds, bisphenylmethane compounds, xanthene compounds, thiazine compounds, spiropyran compounds and the like. Typical examples of them include Crystal Violet lactone, benzoyl leuco methylene blue, Malachite Green Lactone, p-nitrobenzoyl leuco methylene blue, 3-dialkylamino-7-dialkylamino-fluoran, 3-methyl-2,2'-spirobi(benzo-f-chrome), 3,3-bis(p-dimethylaminophenyl)phthalide, 3-(p-dimethylaminophenyl)-3-1,2-dimethylindole-3-yl) phthalide, 3-(p-dimethylaminophenyl)-3-(2-phenylindole-3-yl)phthalide, 3(p-dimethylaminophenyl)-3-(2-phenylindole-3-yl)phthalide, 3,3-bis(1,2-dimethylindole-3-yl)-5-dimethylaminophthalide, 3,3-bis-(1,2-dimethylindole-3-yl) 6-dimethylaminophthalide, 3,3-bis-(9-ethylcarbazole-3-yl)-5-dimethylaminophthalide, 3,3-bis(2-phenylindole-3-yl)-5-dimethylaminophthalide, 3-p-dimethylaminophenyl-3-(1-methyl pyrrole-2-yl)-6-dimethylaminophthalide, 4,4'-bis-dimethylaminobenzhydrin benzyl ether, N-halophenyl leuco Auramine, N-2,4,5-trichlorophenyl leuco Auramine, Rhodamine-Banilinolactam, Rhodamine-(p-nitroanilino) lactam, Rhodamine-B-(p-chloroanihino)lactam, 3-dimethylamino-6-methoxyfluoran, 3-diethylamino-7-methoxyfluoran, 3-diethylamino-7-chloro-6-methylfluroan, 3-diethylamino-6-methyl-7-anilinofluoran, 3-diethylamino-7-(acetylmethylamino)fluoran, 3-diethylamino-7-(dibenzylamino)fluoran, 3-diethylamino-7-(methylbenzylamino)fluoran, 3-diethylamino-7-(chloroethyhnethylamino)fluoran, 3-diethylamino-7-(diethylamino)fluoran, 3-methyl-spiro-dinaphthopyran, 3-ethyl-spiro-dinaphthopyran, 3,3'-dichloro-spiro-dinaphthopyran, 3-benzyl-spiro-dinaphthopyran, 3-methylnaphtho-(3-methoxybenzo)-spirpyran, 3-propyl-spirodibenzoidipyran, etc. Mixtures of these color precursors can be used if desired. The present invention, however, is not limited to the use of the aforementioned color precursors as chromogenic materials. In addition, organic chemicals which are capable of reacting with heavy metal salts to give colored metal complexes, chelates or salts can be adapted for use in this invention.

Substantially any color forming material which can be encapsulated and which will react with a developer material to form an image can be used in the present invention.

In addition to the chromogenic material, the internal phase of the microcapsules also includes a solvent oil. Preferred solvent oils are weakly polar solvents having boiling points above 170° C. and preferably in the range of 180° C. to 300° C. The solvent oil may optionally include a hydrocarbon diluent. The solvent oils used in the present invention are typically those conventionally used in carbonless paper manufacture. These oils are generally characterized by their ability to dissolve Crystal Violet Lactone in a concentration of 0.5 wt % or more. Whether a diluent oil should be used will depend on the solubility of the chromogenic material, the nature of the chromogenic material and the viscosity of the characteristics of the internal phase. Examples of solvent oils include alkylated biphenyls (e.g., monoisopropylbiphenyl), poly-chlorinated biphenyls, castor oil, naphthenic mineral oils, dibutyl phthalate, brominated paraffin, dibutyl famerate, and mixtures thereof. Alkylated biphenyls are generally less toxic and preferred. Examples of diluent oils include mineral oil and deodorized kerosene. Vegetable oils have also been disclosed as solvents for microencapsulation of chromogenic materials in pressure sensitive systems. Examples of useful vegetable oils include soy bean oil, cotton seed oil, licensed oil, rape seed oil, castor oil, sunflower oil and the like. A mixture of two or more of these oils may be used or they may be mixed with other solvents.

The color precursor is incorporated in the internal phase in an amount sufficient to produce a visible image of the desired optical density upon reaction with the developer. In general, these amounts range from approximately 0.5 to about 20.0 percent based on the weight of the internal phase solution (e.g., monomer or oil) containing the chromogen. A preferred range is from about 2 percent to about 10 percent. The amount of the chromogenic material required to obtain suitable images depends on the nature of the chromogen, the nature of the internal phase, the nature of the capsule wall structure, and the size of the microcapsules.

Wall-forming materials which may be useful in the present invention include gelatin (see U.S. Pat. Nos. 2,730, 456 and 2,800,457 to Green et al) including gum arabic, polyvinyl alcohol, carboxymethyl cellulose; resorcinol-formaldehyde (see U.S. Pat. No. 3,755,190 to Hart et al), isocyanate (see U.S. Pat. No. 3,914,511 to Vassiliades), polyurethane (see U.S. Pat. No. 3,796,669 to Kiritani et al), ureaformaldehyde wall-formers and more particularly urea-resorcinol-formaldehyde wall formers (in which oleophilicity is enhanced by the addition of resorcinol) (see U.S. Pat. Nos. 4,001,140; 4,087,376 and 4,089,802 to Foris et al.) melamine-formaldehyde resin, hydroxypropyl cellulose (see U.S. Pat. No. 4,025,455 to Shackle) and polyurea (U.S. Pat. No. 5,643,506 to Rourke). Other wall formers are described in U.S. Pat. No. 3,432,327 to Kan et al. Microencapsulation has been accomplished by a variety of known techniques including coacervation, interfacial polymerization, polymerization of one or more monomers in an oil, as well as various melting, dispersing and cooling methods.

The mean size of the capsules used in the present invention may vary over a broad range but generally ranges from approximately 1 to 25 microns. As a general rule, image resolution improves as the capsule size decreases with the caveat that if the capsule size is too small, the capsule may sit within incongruities in the support and the support may screen the capsules from exposure. Very small capsules may also fail to rupture upon the application of pressure. In view of the foregoing, it has been found that a preferred mean capsule size range is approximately 3 to 15 microns and particularly approximately 5 to 12 microns.

A binder is used to hold components together on the substrate, prevent dusting on press and improve the scuff resistance of the self-contained layer. The amount of binder used in the composition will vary depending upon the nature of the binder material and performance needs. Because the binder can suppress the reactivity of the developer, the amount of binder should be minimized. Generally, the amount of binder is determined by balancing image intensity, printing press performance and scuff resistance. The amount of binder will typically fall within the range of about 2 to 20% and more typically about 5 to 16%.

The binder also acts to enhance the surface strength of the coating as well as to adhere the coating to the substrate or to an adjacent layer. The binder employed may be a natural binder, a synthetic binder or a combination thereof. In one embodiment, a synthetic binder such as polyvinyl alcohol is used alone or in combination with other synthetic binders or with a natural binder such as ethylated cornstarch. Synthetic binders are preferred because they are stronger than natural binders and the surface strength of the self-contained sheet can be maintained without affecting image development. Illustrative examples of synthetic binders include polyvinyl acetate and copolymers thereof, styrene butadiene rubber (SBR), polyvinyl alcohol, polystyrene, butadiene-styrene copolymers, polyvinylpyrrolidone, acrylic homo- or copolymers such as acrylic or methacrylic acids or lower alkyl esters thereof, e.g., ethyl acrylate, butyl acrylate and methyl methacrylate, acrylamide and the like. Illustrative examples of natural binders are gum arabic, casein, sodium alginate, methyl cellulose, carboxymethyl cellulose, dextrin, starch or modified starches, e.g., oxidized, hydrolyzed or hydroxyethylated starch, and the like.

The microcapsule layer and/or the microsphere layer may also include in the coating solution a viscosity increasing additive, typically a water-soluble material, which significantly increases the viscosity of the coating layer to prevent the coating from soaking into the substrate (i.e. to hold out coating on the surface). Further optionally incorporated with the coating composition is one or more dispersing agents (e.g., Dispex N-40, polymeric carboxylic acid from Allied Colloids, Inc.). Other commonly utilized additives such as anti-foaming agents, optical whitening agents (e.g., Tinopal PT-150 from Ciba Geigy Corp.) and lubricants (e.g., Nopcote C-105HS calcium stearate dispersion from Henkel Corp.) may also be added in minor amounts. Clays such as structured clays (e.g., Exsilon 87 and Ansilex 93 from Englehard Corp., as described in U.S. Pat. No. 5,350,729 to Londo et al.) may be present in more significant amounts. For example, structured clays may represent up to about 50% or more by weight of the microsphere/developer layer. Preferably, clays represent from about 25 to 40% of the coatings described herein.

Materials which increase the porous structure of the coating layers are also useful additives to the coating composition. The pores in the coating are believed to facilitate rapid transfer of the chromogenic-containing oil from the microcapsules to the developer materials thereby improving speed of image development and image intensity. Precipitated calcium carbonate (PCC) is one example of a material having a porous structure which improves image intensity of the self-contained imaging sheets of the present invention. The precipitated calcium carbonate preferably is included as a component in the microsphere layer, particularly when the microsphere layer also contains the developer material. The microsphere layer may contain up to about 30% by weight PCC, and preferably contains from about 10 to 20% by weight PCC.

Hold out agents may also be included in one or both layers of the self-contained sheet of the present invention. Hold out agents prevent transfer of coating components through the sheet or substrate. Transfer of the coating through the sheet can cause contamination of the impression roll or other contact points on the paper machine, coater, press, etc. Build up of contamination must eventually be removed by stopping the machine and cleaning the unit resulting in considerable downtime at a significant cost in lost production. An acidified Bentonite clay (Copisil) typically sold as a color developer also functions as an effective hold out agent which decreases strike-through of the coating composition through the substrate. Preferably, the hold out agent is included as a component of the microsphere coating, particularly when the microsphere coating also contains the developer material.

The self-contained coating compositions of this invention may contain any of the various additives known in the carbonless paper art to improve the handling characteristics of the coated copy sheet such as a stilt material (e.g., starch particles), silica particles to prevent specking when a pressure nip is used for capsule rupture, etc.

Components of the microcapsule layer are admixed to produce a relatively homogeneous microcapsule coating. Likewise, components of the microsphere layer are admixed to produce a relatively homogeneous microsphere coating. The coatings are separately coated onto the support by coating means known in the art. For example, air knife coating, Meyer bar coating, roll coating or offset gravure coating may be used. To produce the self-contained sheet of the invention, the microcapsule coating is applied to the substrate first to form a microcapsule layer and then the microsphere layer is applied on top of the microcapsule layer to produce a dual layer self-contained sheet. The dual layers preferably are applied in one pass on a coater equipped with two coating stations. The first coating station applies and dries the microcapsule coating and then the second station applies and dries the microsphere coating. Alternatively, the dual layers can be applied sequentially in separate passes. In practice, the microcapsule layer is applied in an amount of about 0.6 to 2.4 pounds per 1300 sq. ft. and the microsphere layer is applied in an amount of about 0.2 to 2.5 pounds per 1300 sq. ft.

The developer resin is used in an amount sufficient to react with a color precursor and form an image. In a preferred embodiment wherein the developer is incorporated in the microsphere layer, the microsphere layer contains about 4 to 40%, preferably 20 to 30%, developer and about 5 to 50%, preferably 4 to 15%, microspheres by dry weight. When the developer is formulated as part of the microcapsule layer, the developer resin concentration is between about 10% and 30% based on dry weight. Preferably, the amount of developer resin used is about 10% to 20% when present in the microcapsule layer.

Upon application of an image inducing pressure, the hollow spherical plastic pigment particles are believed to collapse, compress, rupture, or dissolve to form an interconnecting network of microscopic voids. The exact mechanism whereby the pigment improves the performance of the self-contained sheet is not clear. The pigment is believed to provide a network of voids which greatly increases the availability of and access to the reactive developer particles by the color precursor. The compressed or ruptured microspheres are believed to provide an increased surface area in the self-contained sheet for reaction between the developer material and the chromogenic materials. Furthermore, by capillary action, the network of voids also imbibe and distribute the chromogenic material and induce its delivery to the newly-exposed reaction sites.

In accordance with one embodiment of the present invention, a combined self-contained coating of developer and microencapsulated color precursor is applied to a substrate at a coat weight of from about 0.8 to 2.4, preferably from about 1.0 to 2.0 #/ream (1300 ft²). A top coating comprising microspheres and a suitable binder is applied over the self-contained coating at a very low coat weight of from about 0.2 to 1.8, preferably from about 0.3 to 1.0 #/ream (1300 ft²). A self-contained paper prepared in accordance with this embodiment of the present invention typically results in an overall reduction in coat weight of approximately 1.0 #/ream as compared to the conventional two pass CF/CB self-contained paper. Advantages attributable to the lower coat weight include reduced materials cost and less sheet distortion, such as cockle and curl. Furthermore, the basis weight of the substrate can be increased by an amount corresponding to the decrease in coating weight by substituting additional fiber, thereby producing a stronger, stiffer self-contained sheet.

Applying the microspheres as a separate top coat over the self-contained imaging layer provides additional benefits beyond those obtained by incorporating microspheres into the developer and microcapsule matrix. The top coat of hollow microsphere pigment particles provides an opaque, white, energy absorbing protective barrier which prevents premature rupture of the microcapsules and yet will still collapse locally in response to an imaging force to allow normal image development. The microspheres in the top coat function as whiteners and brighteners to enhance the appearance of the sheet. The layer of microspheres also enhances the archival quality of the sheet by both inhibiting and masking discoloration of the developer resin.

The microsphere layer tends to exclude oxygen and other deleterious substances which promote yellowing of the developer resin. Furthermore, any yellowing which still occurs is masked by the opaque top coating of microspheres.

Providing the microsphere top coat as a separate coating from the color forming reactants also allows for greater flexibility with respect to binder selection. The effect of the binder on speed of image development and image intensity does not have to be a primary consideration in selecting a binder for the microsphere coating. Therefore, the binder can be selected so as to optimize other characteristics of the self-contained sheet, such as chemical resistance, printability, glueability and surface strength.

The microsphere top coat, because of its resilient compressibility and its opaqueness, both suppresses and masks incidental damage due to handling and secondary operations. The resilient nature of the top coat can also improve print quality by providing more intimate contact between surfaces, such as when a self-contained sheet is used in conjunction with a plain, uncoated ply in a multipart form-set. The hollow microspheres of the top coating collapse when subjected to an imaging force and become transparentized by the oil released from the ruptured microcapsules, thereby revealing the rapidly developing image in the self-contained layer.

To prepare self-contained sheets according to one embodiment, the developer material is mixed with the microcapsule composition and the mixture applied to the substrate web as a single layer self-contained coating. A self-contained coating composition will typically contain about 20 to 60% microcapsules and about 5 to 40% developer material. The top coat will typically contain about 10 to 50% hollow microspheres. The amount of binder will vary depending on the nature of the binder as described above. The self-contained coating typically will be applied at a coat weight of about 1 to 2 pounds per 1300 sq. ft. The practices used in U.S. Pat. No. 4,010,292 to prepare self-contained sheets are also useful in the present invention. Any ordinary coating or printing technique can be used in making imaging sheets in accordance with the invention including such means as air knife, offset gravure, roll or blade coating. The single layer self-contained coating is then topcoated with the microsphere coating at a coat weight of approximately 0.4 #/ream (1300 ft²).

Alternatively, the developer material may be combined with microspheres and overcoated onto a microcapsule-bearing pre-coated layer. In accordance with this embodiment, the microcapsule composition will nominally contain about 55% microcapsules and be applied to a coat weight of about 0.6 to 1.8 pound per 1300 ft². The microsphere layer will typically contain about 4 to 15% microspheres and from about 4 to 40% developer material. The microsphere and developer containing layer will typically be applied at a coat weight of about 1 to 2.5 pounds per 1300 ft². Any ordinary coating or printing technique can be used in making imaging sheets in accordance with this embodiment of the invention including such means as air knife, offset gravure, roll or blade coating.

The present invention is illustrated in more detail by the following non-limiting examples of a dual layer coating wherein the developer is present in the microsphere layer.

Example 1

|  | Dry Weight % |
| --- | --- |
| A. Microcapsule Layer | |
| 1. Capsules | 65 |
| 2. Stilts | 25 |
| 3. PVA | 5 |
| 4. Starch | 5 |
| B. Microsphere Layer | |
| 1. Developer | 23 |
| 2. Clays (3) | 35 |
| 3. PCC | 15 |
| 4. Microspheres | 10 |
| 5. PVA | 7 |
| 6. Starch | 7 |
| 7. Other | 3 |

|  | Dry Weight % |
| --- | --- |
| A. Microsphere Layer | |
| 1. Capsules | 55 |
| 2. Stilts | 34 |
| 3. Starch | 10 |
| 4. Other | 1 |
| B. Microsphere Layer | |
| 1. Developer | 24 |
| 2. Clays | 33.8 |
| 3. PCC | 15 |
| 4. Microspheres | 10 |
| 5. Other | 17.2 |

While the invention has been described herein by reference to specific embodiments thereof, it will be apparent that numerous modifications and variations are possible without departing from the spirit and scope of the following claims.

What is claimed is:

1. A self-contained sheet for forming an image comprising:

a support;

a first layer of microcapsules containing a color precursor of the electron donating type in a carrier liquid on the surface of the support;

a layer of microspheres overlying the microcapsule layer; and a developer material present in at least one of the microcapsule layer or microsphere layer wherein the developer material can react with the color precursor to form a visible image when the color precursor is released from the microcapsules.

2. The self-contained sheet of claim 1 wherein said developer material is present in said microsphere layer.

3. The self-contained sheet of claim 2 wherein said layer of microspheres additionally includes a binder.

4. The self-contained sheet of claim 3 wherein said binder is a synthetic binder, a natural binder or a mixture thereof.

5. The self-contained sheet of claim 4 wherein said binder is selected from the group consisting of polyvinyl acetate, polyvinyl alcohol, styrene butadiene copolymer, starch, gum arabic and mixtures thereof.

6. The self-contained sheet of claim 2 wherein said developer material is a phenolic resin.

7. The self-contained sheet of claim 2 wherein said developer material is an acid clay.

8. The self-contained sheet of claim 2 wherein said microspheres have a diameter of about 0.3 to 15 micron and are formed from an elastic synthetic organic polymer.

9. The self-contained sheet of claim 2 wherein said layer of microspheres is applied at a coat weight of about 1.0 to 2.5 #/ream of 1300 sq. ft.

10. The self-contained sheet of claim 2 wherein said layer of microspheres and said microcapsule layer have a combined coat weight of about 1.6 to 4 #/ream of 1300 sq. ft.

11. The self contained sheet of claim 2 wherein said microsphere layer further comprises a hold out agent.

12. The self-contained sheet of claim 11 wherein said holdout agent is an acidified Bentonite clay.

13. The self-contained sheet of claim 2 wherein said microsphere layer further comprises precipitated calcium carbonate.

14. The self-contained sheet of claim 2 wherein said microsphere layer comprises from about 4 to 40% developer, 25 to 40% clays, 4 to 15% microspheres and 5 to 16% of a binder by dry weight.

15. The self-contained sheet of claim 14 wherein said microsphere layer further comprises from about 10 to 20% by dry weight precipitated calcium carbonate.

16. The self-contained sheet of claim 15 wherein said developer material is a phenolic resin.

17. The self-contained sheet of claim 1 wherein said developer material is present in said microcapsule layer.

18. The self-contained sheet of claim 17 wherein said developer material is a phenolic resin.

19. The self-contained sheet of claim 17 wherein said microspheres have a diameter of about 0.3 to 15 micron and are formed from an elastic synthetic organic polymer.

20. The self-contained sheet of claim 19 wherein said microspheres are present in an amount from about 10 to 50% by weight of the microsphere layer.

21. The self-contained sheet of claim 17 wherein said microcapsule layer is applied at a coat weight of about 1 to 2 #/ream of 1300 ft$^2$ and said layer of microspheres is applied at a coat weight of about 0.3 to 1 #/ream of 1300 ft$^2$.

* * * * *